United States Patent [19]

Elings et al.

[11] Patent Number: 5,198,715

[45] Date of Patent: Mar. 30, 1993

[54] SCANNER FOR SCANNING PROBE MICROSCOPES HAVING REDUCED Z-AXIS NON-LINEARITY

[75] Inventors: Virgil B. Elings; John A. Gurley, both of Santa Barbara, Calif.

[73] Assignee: Digital Instruments, Inc., Santa Barbara, Calif.

[21] Appl. No.: 793,245

[22] Filed: Nov. 12, 1991

Related U.S. Application Data

[63] Continuation of Ser. No. 527,561, May 23, 1990, abandoned.

[51] Int. Cl.⁵ .............................................. H01L 41/08
[52] U.S. Cl. ..................... 310/328; 310/366; 310/369
[58] Field of Search ........................ 310/328, 366, 369

[56] References Cited

U.S. PATENT DOCUMENTS

| | | | |
|---|---|---|---|
| 3,215,078 | 11/1965 | Stec | 310/328 |
| 3,835,340 | 9/1974 | Schildkraut | 310/366 |
| 4,087,715 | 5/1978 | Myer | 310/369 |
| 4,263,527 | 4/1981 | Comstock | 310/316 |
| 4,772,817 | 9/1988 | Aida et al. | 310/328 |
| 4,785,177 | 11/1988 | Besocke | 310/369 |
| 4,810,913 | 3/1989 | Beauducel et al. | 310/337 |
| 4,871,938 | 10/1989 | Elings et al. | 310/328 |

FOREIGN PATENT DOCUMENTS

| | | | |
|---|---|---|---|
| 0413397 | 2/1991 | European Pat. Off. | 310/328 |
| 62-43665 | 2/1987 | Japan | |
| 0044787 | 2/1990 | Japan | 310/328 |

Primary Examiner—Mark O. Budd
Assistant Examiner—Thomas M. Dougherty
Attorney, Agent, or Firm—Oblon, Spivak, McClelland, Maier & Neustadt

[57] ABSTRACT

This invention relates to Scanning Probe Microscopes (SPMs) and the like that use piezoelectric type scanners. The scanner described herein limits non-linear errors in the vertical scan direction while maintaining a large horizontal scan size. A tube scanner is shown wherein the tube comprises two portions. The first tube has first (x,y) electrodes attached thereto and is of a first piezoelectric material having high sensitivity qualities in response to voltages applied to the first electrodes. The second tube has second (z) elecrodes attached thereto and is of a second piezoelectric material having sensitivity qualities in response to voltages applied to the second electrodes which are lower than those of the first piezoelectric material. In one embodiment, the first tube and the second tube have substantially identical diameters and are attached to each other in end-to-end concentric relationship. In another embodiment, the first tube and the second tube have different diameters and are connected to each other in end-to-end concentric relationship with the second tube associated with z motion having a smaller diameter and being disposed within the first tube associated with x and y motion. To achieve preferred results, the second tube associated with z motion has thinner sidewalls than the first tube.

8 Claims, 1 Drawing Sheet

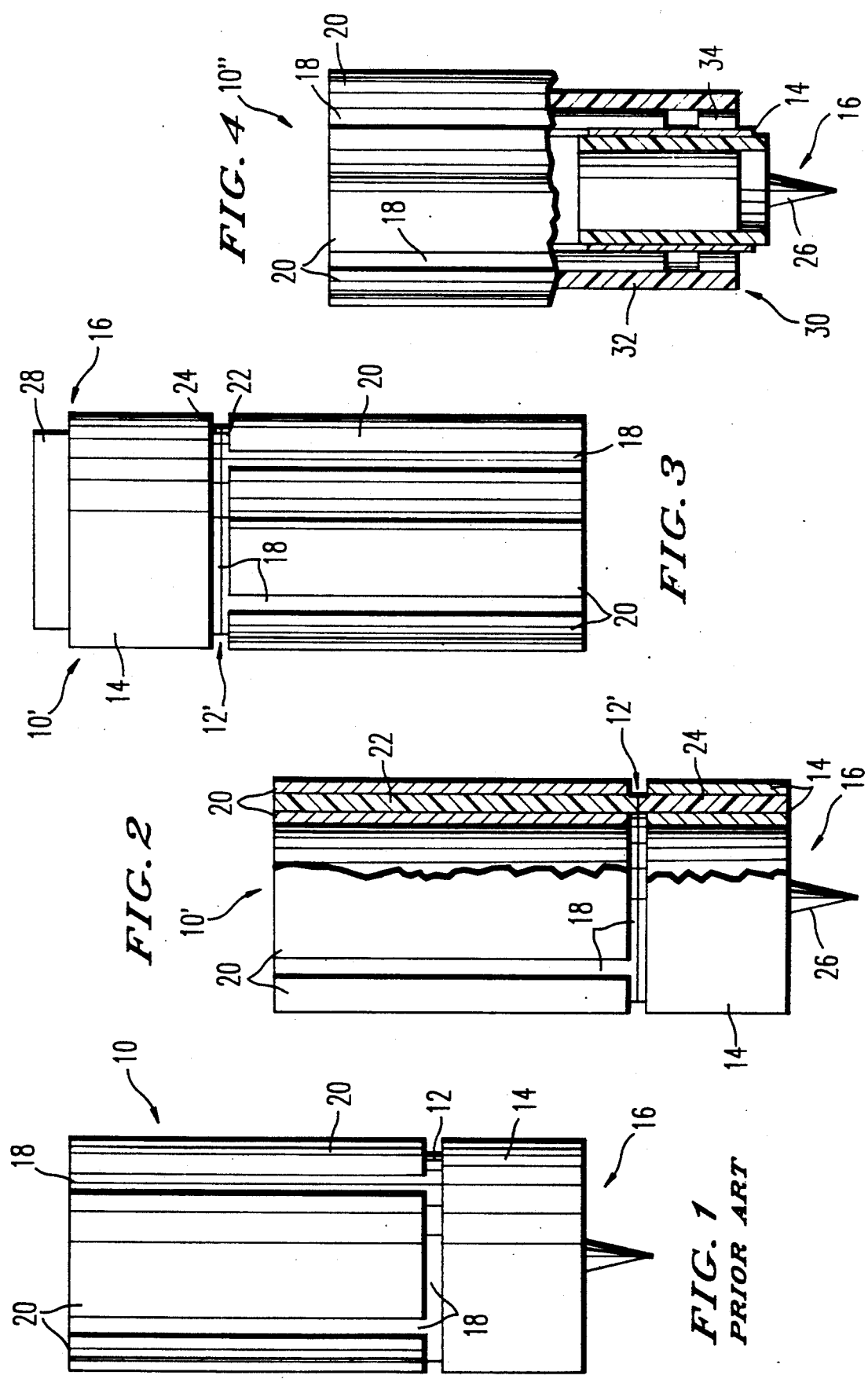

SCANNER FOR SCANNING PROBE MICROSCOPES HAVING REDUCED Z-AXIS NON-LINEARITY

This is a continuation of application Ser. No. 527,561, filed May 23, 1990, now abandoned.

BACKGROUND OF THE INVENTION

This invention relates to a scanner employed in instruments such as scanning probe microscopes and, more particularly, in a piezoelectric scanner having first electrodes attached to a member of a piezoelectric material for creating x and y motion of a scan end and second electrodes attached to a member of a piezoelectric material for creating z motion of the scan end perpendicular to the x and y motion, to the improvement for reducing non-linearity and other error-producing phenomenon associated with the z motion comprising, the member comprising two portions, a first portion having the first electrodes attached thereto being of a first piezoelectric material having high sensitivity qualities in response to voltages applied to the first electrodes, a second portion having the second electrodes attached thereto being of a second piezoelectric material having sensitivity qualities in response to voltages applied to the second electrodes which are low with respect to non-linear behavior.

Scanning probe microscopes are instruments that provide high resolution information about the properties of surfaces. One common use of these devices is imaging, and some types of SPM have the capability of imaging individual atoms. Along with images, SPMs can be used to measure a variety of surface properties over the range from a few angstroms to hundreds of microns. For many applications, SPMS can provide lateral and vertical resolution that is not obtainable from any other type of device.

The first type of SPM developed was the scanning tunneling microscope (STM). The STM places a sharp, conducting tip near a surface. The surface is biased at a potential relative to the tip. When the tip is brought near the surface, a current will flow in the tip due to the tunneling effect. Tunneling will occur between the atom closest to the surface in the tip and the atoms on the surface. This current is a function of the distance between the tip and the surface, and typically the tip has to be within 20 angstroms of the surface for measurable current to be present. An STM has a mechanism to scan the tip over the surface, typically in a raster pattern. While the tip is scanned over the surface, the tip is kept at a constant distance above surface features by means of a feedback loop between the tunneling current and a vertical position controlling mechanism. The feedback loop adjusts the vertical position of the tip to keep the tunneling current, and thus the distance, constant. The vertical position of the tip is determined from the control signals applied to the vertical position controlling mechanism. The vertical position, as a function of horizontal scan position produces a topographic map of the surface. STMs can easily image individual atoms and can also be used for highly accurate surface measurements on larger scales, up to a few hundred microns. STMs also may be used for other data than topographic images. One alternative operation of an STM is to hold the tip stationary while varying the bias voltage applied to the sample and monitor the tunneling current, thus measuring local current/voltage characteristics of the surface. STMs require a conducting sample surface for operation. Non-conducting surfaces may be coated with a thin conducting material such as gold. In some cases, non-conducting materials a few atoms thick lying on a conducting surface may be imaged.

Another SPM, the atomic force microscope (AFM), similarly scans a tip across a surface. The tip in this case is mounted on the free end of a lever or cantilever which is fixed at the other end. The tip is brought to a surface such that the force interaction of the tip with the surface causes the cantilever to deflect. An AFM may be operated such that the Van der Waals attractive force between the tip and surface are near equilibrium with the repulsive force, or at larger cantilever deflections where the repulsive force dominates. A feedback loop between the cantilever deflection information and the tip vertical position can be used to adjust the vertical position of the tip as it is scanned. The feedback loop keeps the deflection, and thus the force, constant. The tip vertical position versus horizontal scan provides the topographic surface map. In this mode, the forces on the surface can be made very small—so small as not to deform biological molecules. AFMs can also be operated in a mode where the repulsive force deflects the cantilever as it scans the surface. The deflection of the tip as it is scanned provides topographic information about the surface. AFMs may also be operated in a non-contact mode where a means is used to vibrate the cantilever and the Van der Waals interaction between the tip and surface affect the vibration frequency. AFMs have a means to detect the small movements of the cantilever. Several means for cantilever motion detection have been used with the most common method employing reflected light from the cantilever. The deflection of a light beam due to the cantilever motion may be detected, or the movement of the cantilever may be used to generate interference effects which can be used to derive the motion. Like an STM, AFMs can image individual atoms; but, unlike an STM, AFMs can be used for non-conducting surfaces. AFMs may also be used for measurements such as surface stiffness.

Other SPMs may use different probing mechanisms to measure properties of surfaces. Probing devices have been developed for such properties as electric field, magnetic field, photon excitation, capacitance, and ionic conductance. Whatever the probing mechanism, most SPMS have common characteristics, typically operating on an interaction between probe and surface that is confined to a very small lateral area and is extremely sensitive to vertical position. Most SPMs possess the ability to position a probe very accurately in three dimensions and use high performance feedback systems to control the motion of the probe relative to the surface.

In the above-described devices, the positioning and scanning of the probe is usually accomplished with piezoelectric devices. These devices expand or contract when a voltage is applied to them and typically have sensitivities of a few angstroms to hundreds of angstroms per volt. Scanning is implemented in a variety of ways. Some SPMs hold the tip fixed and attach the sample to the scanning mechanism while others scan the tip. Hollow piezoelectric tubes have been found to be the best scanning mechanism for most applications. These tubes are capable of generating three dimensional scans. They are mechanically very stiff, have good frequency response for fast scans, and are relatively inexpensive to manufacture and assemble. Such scanners are used in the commercial STM sold by the assignee of this application, Digital Instruments, Inc. of Santa Barbara, Calif., under the trademark NanoScope. These scanners are made in various lengths, the larger ones having larger scan ranges. This application is specifically related to SPMs which use these tube-type scanners, although its subject matter could be used for other configuration scanners.

FIG. 1 shows a prior art design for a large area scanner generally indicated as 10. Plated on to the tube 12 is a z electrode 14 that covers the circumference of the tube 12 at the scan end 16. Not shown, plated on to the inside of the tube 12 is a matching electrode that may be attached to ground for shielding, or to a complementary z drive voltage for greater electric field strength. Separated by a small insulating gap 18 from each other and from the z electrode 14, are x and y electrodes 20. Also not shown, on the inside of the tube 12 are matching electrodes (to the electrodes 20) that are grounded for shielding or driven at complementary voltages to the outside electrodes 20, allowing for higher electric field strength. For both x and y there are two sets of electrodes 20 disposed on opposite sides of the tube 12, both of which consist of a complementary pair on the inside and outside of the tube 12. Such a design can produce very large scans with voltages that can be achieved with off-the-shelf integrated circuits. A scanner of this type is described in a co-pending patent application which is assigned to the common assignee of this application and entitled SCANNER FOR A SCANNING PROBE MICROSCOPE by Virgil B. Elings et al. (Ser. No. 305,637; filed Feb. 3, 1989). Because the scanner is made of high sensitivity piezoelectric material, the vertical image distortion due to non-linear effects can be significant.

An important improvement needs to be made to this type of scanner. The requirement for very large travel is only for the lateral scans. Tube type scanners such as the scanner 10 of FIG. 1 can achieve large displacements laterally due to the lever arm on the bending motions at the end of the tube away from the scan end 16 (which is the fixed end); however, the amount of expansion and contraction that is possible in the z direction is limited for such tube type scanners to a few microns maximum. For most applications, such as biological imaging, semiconductor measurements, storage media characterization, and many others, even for large scan areas the requirement for z travel seldom exceeds a few microns.

The scanner 10 shown in FIG. 1 can achieve 75 microns of travel in the x and y directions and 5 microns in the z direction for the maximum drive voltages available from a typical SPM system. The 5 microns for z exceeds the requirements for many applications. In general, for any scanner configuration an improved design that maintained x and y scan size with less z travel would be extremely useful, if the performance for z could be substantially improved.

The ability of piezoelectric materials to produce controlled incremental movements of very small size is critical to the operation of SPMs as no other positioning devices exist with adequate resolution, response time, or controllability. Piezoelectric materials, however, although they make SPMs possible, do not have ideal characteristics. The actual characteristics of these materials have a significant effect on performance.

Two sources of error that affect SPM scanners are well known in the art. One is hysteresis and the other is drift. Piezoelectric materials have the property that the amount of expansion for a given applied voltage is dependent on whether the previous applied voltage was higher or lower. Generally, these devices have expansion versus applied voltage characteristics that do not follow the same curve for increasing voltage as for decreasing voltage. Rather, their behavior follows a hysteresis curve. This non-linearity, although rarely specified by manufacturers, increases with sensitivity, i.e. materials with low expansion coefficients have less pronounced hysteresis behavior than materials with higher coefficients.

The other error source is piezoelectric drift or creep. Piezoelectric materials have the property that they continue to expand or contract at a logarithmically decreasing rate in the same direction as the last applied change. This source of non-linearity also increases with the sensitivity of the material. Other contributions to non-linear behavior may exist depending on the scan drive waveform characteristics.

The problem can be illustrated for the case where the SPM provides surface topography data. In this case, the lateral scan motions, x and y, are produced by causing the scanner to generate a so-called "raster" scan. If the relation between voltage and scan motion were linear, the raster scan motion would be produced by applying linear ramp voltages to the x and y electrodes. The vertical scanner drive voltage is used to derive probe position, and probe position as a function of x and y for a raster scan is a topographic map. As the probe is scanned, the feedback loop between the z position and the sense parameter will provide whatever z drive voltage is required to maintain a constant relation between the probe and sample. The feedback loop supplies z scan drive voltages that place the probe at a particular position and does not care whether the relation between voltage and position is linear or not. Therefore, even though the probe will follow the surface precisely because of feedback, the true relationship between applied voltage and scanner position must be known to interpret the vertical position data correctly from the applied voltage.

The x and y scan non-linearities can be corrected for. Correcting for x and y non-linearities for a raster scan involves creating a waveform that when applied to the scanner produces the motion that a ramp voltage would produce for a linear system. Deriving a relationship that provided good linearization of scanner motion for the case of a linear ramp has been accomplished and produced excellent results, as described in an earlier co-pending application of the common assignee of this application entitled "METHOD OF DRIVING A PIEZOELECTRIC SCANNER LINEARLY WITH TIME" by Virgil B. Elings et al. (Ser. No. 344,750; filed Apr. 28, 1989). The contribution of non-linear response from the various sources such as hysteresis, drift etc., however, is a function of the drive waveform and the relationship that provides good results for a ramp is not valid in general. For z, the drive waveform is a function of the sample surface and may contain any shape that is encountered on a sample surface. The functions that describe the non-linear behavior of piezoelectric scanners for all possible drive waveforms are not known, and would be extremely difficult to determine. It is not possible to correct for z non-linearity in a similar fashion to the x and y correction, and vertical position data must be derived assuming the relationship between drive voltage and vertical position is linear. All SPMS are presently operated in this manner.

Piezoelectric non-linearity in the vertical motion affects SPM data by distorting the surface features, adding artifacts to the data, and introducing errors into quantitative position measurements. The effects become much more significant for large scale scans, particularly for tube type scanners. To achieve larger scan sizes and higher scan rates for x and y requires using high sensitivity piezoelectric materials, which have more pronounced non-linear behavior. In addition, the non-linear behavior tends to increase with the amount of expansion or contraction, and the larger images often have larger features which require greater vertical motion. Clearly, the desired scanner characteristics for large lateral scanning are detrimental to performance in the vertical motion.

Wherefore, it is an object of this invention to provide a tube type scanner which is capable of performing large lateral scans while minimizing the introduction of non-linearity problems in the z-axis data reflecting surface features.

It is another object of this invention to provide a tube type scanner which is capable of performing large lateral scans while eliminating (or at least minimizing) the distortion of surface features, the adding of artifacts to the data, and the introducing of errors into quantitative position measurements.

Other objects and benefits of the invention will become apparent from the detailed description which follows hereinafter when taken in conjunction with the drawing figures which accompany it.

SUMMARY

The foregoing objects have been achieved in a piezoelectric scanner comprising a tube of a piezoelectric material with a fixed end and a non-fixed scan end and having first electrodes attached to the tube for creating x and y motion of the scan end and second electrodes attached to the tube for creating z motion of the scan end perpendicular to the x and y motion, by the improvement of the present invention to reduce non-linearity and other error-producing phenomenon associated with the z motion comprising, the tube comprising two portions being a first tube and a second tube, the first tube having the first electrodes attached thereto and being of a first piezoelectric material having high sensitivity qualities in response to voltages applied to the first electrodes, the second tube having the second electrodes attached thereto and being of a second piezoelectric material having sensitivity qualities in response to voltages applied to the second electrodes which are lower than those of the first piezoelectric material.

In one embodiment, the first and second tubes have substantially identical diameters and are attached to each other in end-to-end concentric relationship.

In another embodiment, the first and second tubes have different diameters and are connected to each other in end-to-end concentric relationship with the second tube associated with z motion having a smaller diameter and being disposed within the first tube associated with x and y motion.

In a preferred arrangement, the second tube associated with z motion has thinner sidewalls than the first tube whereby the second tube is lighter and has a better dynamic response as well as a higher electric field and greater motion for the same applied voltage than the first tube. Also, the first piezoelectric material is chosen to have qualities which maximize size of x and y motion of the scan end and the second piezoelectric material is chosen to have qualities which minimize non-linearity attributes of the z motion.

DESCRIPTION OF THE DRAWINGS

FIG. 1 is a high performance large scan size piezoelectric tube scanner according to the prior art.

FIG. 2 is a high performance large scan size piezoelectric tube scanner according to the present invention in a first embodiment with the probe mounted on the scanner.

FIG. 3 is a high performance large scan size piezoelectric tube scanner according to the embodiment of FIG. 2 with the sample mounted to the scanner.

FIG. 4 is an alternate embodiment of a high performance large scan size piezoelectric tube scanner according to the present invention.

DESCRIPTION OF THE PREFERRED EMBODIMENT

The tube scanner of this invention separates the lateral and vertical scan functions of a tube scanner to yield significantly improved performance in vertical positioning—without sacrificing the lateral performance required for large scans. The basis of the invention is an improved scanner design that has significantly less piezoelectric material error sources for the z travel; but, which retains large x and y scan size. This improved scanner is illustrated in FIG. 2, where it is generally indicated as 10', as an improved version of the scanner 10 of FIG. 1. It should be understood, however, that although the basic prior art scanner tube construction of FIG. 1 is employed by way of example, this is for convenience only and the implementation would be applicable to many scanner designs, not just the configuration of FIG. 1. It is the inventors' intent, therefore, that this invention be accorded a breadth in accordance with the scope and spirit of the disclosure which follows hereinafter.

The objects of this invention are realized by making the tube 12' as a composite structure composed of two sections of piezoelectric materials. One, in this case the upper section 22, is made of high sensitivity material that is acted on by the x and y electrodes 20 while the other, in this case the lower section 24, is made of much lower sensitivity material (and thus much less non-linear) that is acted on by the z electrodes 14. Employing this composite construction for the tube 12', the z section (i.e. lower section 24) exhibits significantly reduced piezoelectric non-linearity error than the x and y section (i.e. upper section 22) while the x and y section retains large travel. The implementation shown in FIG. 2 has a scanning probe 26 mounted to the scanner 10' at the scan end 16 in the manner of the scanner 10 of FIG. 1. As those skilled in the art will readily recognize and appreciate, a sample holder 28 could also be mounted on the scan end 16 of the scanner 10', if desired for the particular application, as depicted in FIG. 3.

The above-described improvement of using a two section scanner applies to any piezoelectric scanner configuration where the x and y electrodes are separated from the z electrodes, thereby allowing the material of the scanner to be sectioned accordingly. The sections, e.g. 22, 24, can be bonded together easily using different techniques, the simplest of which is to epoxy the two sections together. For the typical case where less z travel can be accepted, this improvement allows for the same drive voltages to be used as for the prior art scanner 10 of FIG. 1.

FIG. 4 shows another embodiment of the improvement of this invention, generally indicated as 10''. In this embodiment, the z section is a separate, smaller diameter tube 30 mounted inside the x-y section tube 32. As the z motions are so much less than the x and y motions and do not require bending of the piezoelectric material, the z tube 30 can be made smaller and with thinner walls 34. A smaller, thinner z section is also lighter, which makes for better dynamic response; and, the thinner walls 34 allow for higher electric field and, therefore, greater motion for the same applied voltage compared to the thicker walled tube 32.

As those skilled in the art will recognize and appreciate, the embodiment of FIGS. 2 and 3 could also incorporate thinner walls for the section 24 having the z electrodes 14 attached thereto than the walls of the section 22 having the x, y electrodes 20 attached thereto for the same reasons as set forth above with respect to the embodiment of FIG. 4 and thereby achieve the same benefits.

Having thus described the present invention, what is claimed is:

1. In a piezoelectric scanner having first electrodes attached to a first tubular member of a piezoelectric material for creating lateral x and y motion of a scan end and second electrodes attached to a second tubular member of a piezoelectric material for creating z motion of the scan end perpendicular to the x and y motion wherein the first tubular member has a fixed end and a free end, the improvement comprising:
   a) the first tubular member and the second tubular member being comprised of two separate sections of substantially equal diameter joined together in end-to-end concentric relationship at the free end of the first tubular member with the scan end being an end of the second tubular member farthest from the fixed end of the first tubular member;
   b) said sections being of different piezoelectric materials both being able to produce a respective long range scan;
   c) the piezoelectric material of a section comprising the first tubular member being of a type which produces a long range scan longer than that of the second tubular member; and
   d) the piezoelectric material of a section comprising the second tubular member being of a type which produces a highly linear response.

2. The improvement to a piezoelectric scanner of claim 1 wherein:
   a tube comprising the second tubular member associated with z motion has thinner sidewalls than a tube comprising the first tubular member whereby a higher electric field is produced in the second tubular member for a same applied voltage.

3. In a piezoelectric scanner comprising a tube of a piezoelectric material with a fixed end and a non-fixed scan end and having first electrodes attached to the tube adjacent the fixed end for creating lateral x and y motion of the scan end and second electrodes attached to the tube adjacent the non-fixed scan end for creating z motion of the scan end perpendicular to the x and y motion, the improvement comprising:
   the tube comprising two portions being a first tube and a separate second tube, said first tube being of a first piezoelectric material which produces a long range scan, said second tube being of a second piezoelectric material which produces a highly linear response and also produces a long range scan which is shorter in range than said first piezoelectric material.

4. The improvement to a piezoelectric scanner of claim 3 wherein:
   said first tube and said second tube have substantially identical diameters and are attached to each other in end-to-end concentric relationship.

5. The improvement to a piezoelectric scanner of claim 3 wherein:
   said second tube associated with z motion has thinner sidewalls than said first tube whereby a higher electric field is produced in said second tube for a same applied voltage.

6. The improvement to a piezoelectric scanner of claim 3 wherein:
   said first tube and said second tube have different diameters and are connected to each other in end-to-end concentric relationship with said second tube associated with z motion having a smaller diameter and being disposed within said first tube associated with x and y motion.

7. In a piezoelectric scanner having first electrodes attached to a first tubular member of a piezoelectric material for creating lateral x and y motion of a scan end and second electrodes attached to a second tubular member of a piezoelectric material for creating z motion of the scan end perpendicular to the x and y motion, wherein the first tubular member has a fixed end and a free end, the improvement comprising:
   a) the first tubular member and the second tubular member being comprised of tubes having different diameters connected to each other in end-to-end concentric relationship at the free end of the first tubular member with the scan end being an end of the second tubular member farthest from the fixed end of the first tubular member, the tube of the second tubular member associated with z motion having a smaller diameter and being disposed within the tube comprising the first tubular member associated with x and y motions;
   b) said tubes being of different piezoelectric materials both being able to produce a respective long range scan;
   c) the piezoelectric material of the tube comprising the first tubular member being of a type which produces a long range scan longer than that of the second tubular member; and
   d) the piezoelectric material of the tube comprising the second tubular member being of a type which produces a highly linear response.

8. The improvement to a piezoelectric scanner of claim 7 wherein:
   said tube comprising the second tubular member has thinner sidewalls than said tube comprising the first tubular member whereby a higher electric field is produced in the second tubular member for a same applied voltage.

* * * * *